United States Patent [19]
Iwakiri

[11] Patent Number: 5,801,981
[45] Date of Patent: Sep. 1, 1998

[54] SERIAL ACCESS MEMORY WITH REDUCED LOOP-LINE DELAY

[75] Inventor: Itsuro Iwakiri, Miyazaki, Japan

[73] Assignee: Oki Electric Industry Co., Ltd., Tokyo, Japan

[21] Appl. No.: 901,680

[22] Filed: Jul. 28, 1997

Related U.S. Application Data

[63] Continuation of Ser. No. 627,108, Apr. 3, 1996, abandoned.

[30] Foreign Application Priority Data

May 16, 1995 [JP] Japan .................................. 7-117065

[51] Int. Cl.$^6$ .................................................. G11C 13/00
[52] U.S. Cl. ........................... 365/73; 365/78; 365/233
[58] Field of Search .............................. 365/73, 76, 77, 365/78, 233

[56] References Cited

U.S. PATENT DOCUMENTS 4,566,040  1/1986  Ozawa et al. .
5,117,388  5/1992  Nakano et al. ........................ 365/78

FOREIGN PATENT DOCUMENTS 0 031 950  7/1981  European Pat. Off. .
0 363 031  4/1990  European Pat. Off. .
0 547 830  6/1993  European Pat. Off. .

OTHER PUBLICATIONS

Dense static RAM speed data access in memory-intensive systems William Righter 2328 Electronic Design Oct. 4, 1984, No. 20, Waseca, Minnesota, pp. 245–252.

*Primary Examiner*—Terrell W. Fears
*Attorney, Agent, or Firm*—Spencer & Frank

[57] ABSTRACT

According to one aspect of the invention, a serial access memory has multiple shift registers that are clocked simultaneously for designating column addresses. Each shift register shifts an enabling signal that enables access to a certain number of bits at a time. By operating together, the shift registers enable simultaneous access to a multiple of that number of bits. This multiple can be varied to design serial access memories with different word widths. According to another aspect of the invention, there need be only one shift register, but its stages are interleaved. The enabling signal is shifted from a first end of the shift register to a second end, skipping every other stage, then shifted back from the second end to the first end through the stages that were skipped. This operation is repeated cyclically.

22 Claims, 11 Drawing Sheets

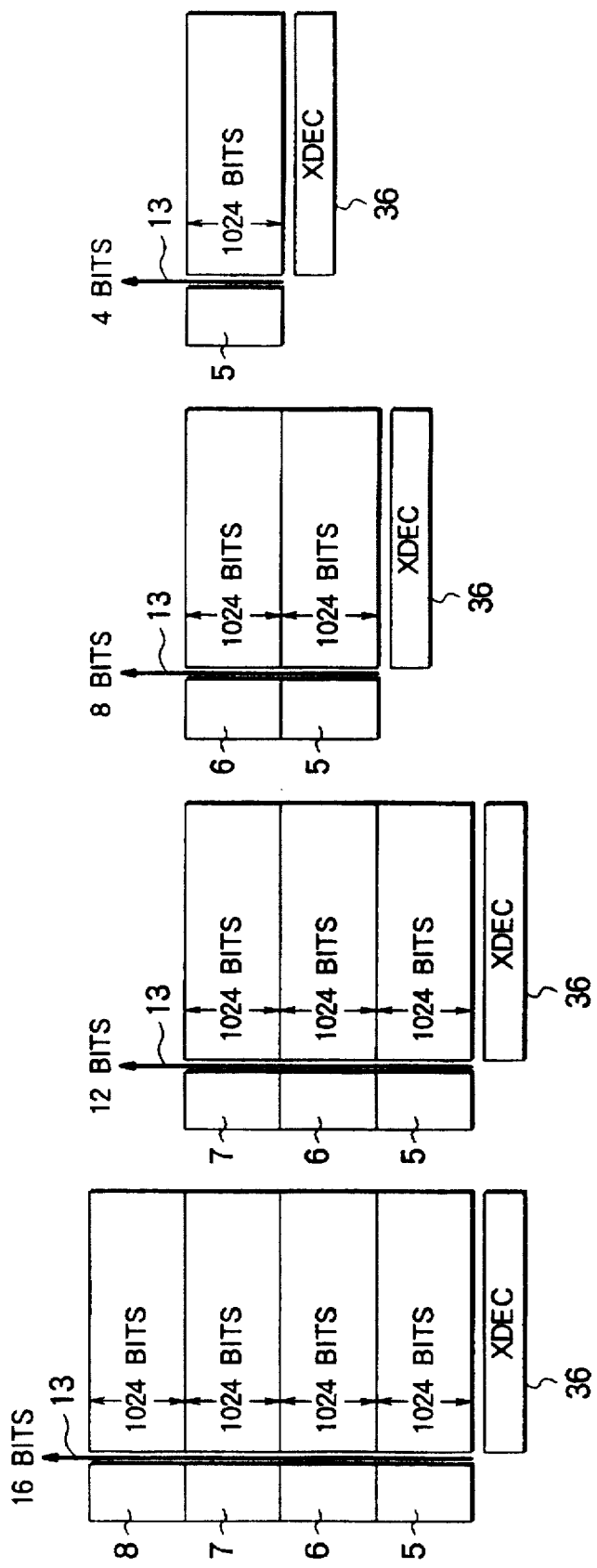

SERIAL ACCESS MEMORY WITH REDUCED LOOP-LINE DELAY

This application is a continuation of application Ser. No. 08/627,108, filed Apr. 3, 1996 now abandoned.

BACKGROUND OF THE INVENTION

The present invention relates to a serial access memory, more particularly to the column addressing circuitry thereof.

In response to an externally applied clock signal, a serial access memory provides access to memory cells located at successive column addresses in a row-column array. Memories of this type are used in the processing of digital video signals, to name just one of many applications. A recent trend is toward memories that provide access to comparatively many memory cells (e.g. sixteen cells) at a time. Such memories are said to have a wide-word organization; the number of memory cells accessed simultaneously will be referred to below as the word width.

Another trend is toward higher clock rates. At fast clock rates, it has been found advantageous to use a shift register for designating column addresses, instead of the address counter and decoder employed in the past. The reason is that shifting a signal in a shift register takes less time than does incrementing an address counter, then decoding the output of the address counter.

In a conventional serial access memory, the shift register, referred to as a pointer register, has N stages, where N is the number of column addresses. The output from each stage controls access to B pairs of bit lines through which memory cells are accessed, where B is the word width. The shift-register stages are disposed side by side, in sequential order from stage one to stage N. Only one stage is active at a time, the active stage shifting from one stage to the next in response to the clock signal. When stage N becomes active, in the next clock cycle stage one is activated again by means of a loop signal carried from stage N to stage one on a loop signal line.

A problem in the conventional serial access memory is that as the word width B increases, so does the size of each register stage, hence the length of the loop signal line. In addition to taking up space, the lengthened loop signal line has increased electrical resistance and capacitance, creating a significant propagation delay for the loop signal. This loop delay necessitates a long cycle time when access wraps around from the last column address to the first column address. That in turn sets a low maximum limit on the clock rate.

Another problem is that when a manufacturer offers a selection of serial access memory products with different organizations, a different shift-register design is necessary for each word width. Also, the different word widths lead to different maximum clock-rate specifications.

SUMMARY OF THE INVENTION

It is accordingly an object of the present invention to reduce the loop delay in a serial access memory employing a shift register for column addressing.

Another object of the invention is to simplify the design of a family of serial access memories having different word organizations.

A further object is to reduce the size of wide-word serial access memories.

According to a first aspect of the invention, a serial access memory has P shift registers, where P is an integer greater than one. The P shift registers are clocked simultaneously by a clock signal. Each shift register has N stages, each stage controlling access to Q memory cells at a time, where Q is a positive integer, and N is an integer greater than one.

A resetting circuit initializes all P shift registers simultaneously to a state in which just one stage in each shift register holds an enabling signal enabling access to a set of Q memory cells. Together, the P shift registers enable access to a set of P×Q memory cells at once.

The enabling signals are then shifted simultaneously through the P shift registers by the clock signal, so that access to different sets of P×Q memory cells is enabled in different clock cycles.

According to a second aspect of the invention, a family of serial access memories consists of serial access memories as described above, with identical values of N and Q and different values of P.

According to a third aspect of the invention, a serial access memory has a single N-stage shift register through which a single enabling signal is shifted as described above. The enabling signal is shifted from a first end of the shift register to a second end at intervals of two stages, skipping every other stage, then shifted back from the second end to the first end through the hat were skipped. This shifting operation is repeated cyclically.

BRIEF DESCRIPTION OF THE DRAWINGS

FIG. 6 is a block diagram of a novel serial access memory with a sixteen-bit word organization.

FIG. 7 is a block diagram of a novel serial access memory with a twelve-bit word organization.

FIG. 8 is a block diagram of a novel serial access memory with an eight-bit word organization.

FIG. 9 is a block diagram of a serial access memory with a four-bit word organization.

DETAILED DESCRIPTION OF THE INVENTION

Embodiments of the invention will be described with reference to the attached illustrative drawings. In these drawings, rows are vertical and columns are horizontal.

Figure 1:
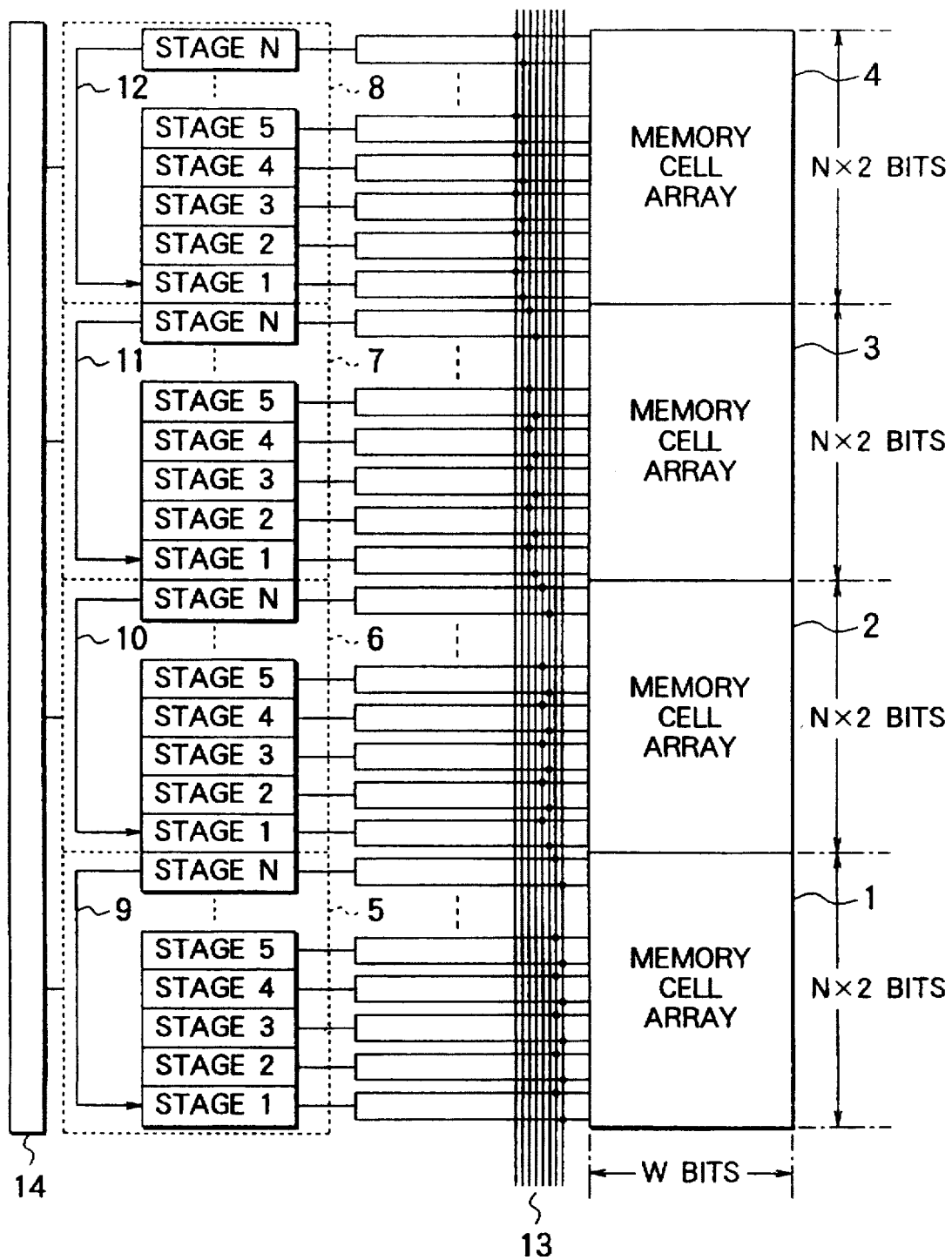
FIG. 1 is a block diagram of a novel serial access memory with an eight-bit word organization.

Referring to FIG. 1, a first embodiment is a serial access memory with a W×N×8 organization, having W row addresses, N column addresses, and eight memory cells at each row-column address. The memory cells (not shown) are disposed in four memory cell arrays 1, 2, 3, and 4, each array having a W×N×2 organization. Column addresses in the four memory cell arrays 1, 2, 3, and 4 are designated by four shift registers 5, 6, 7, and 8, each having N stages. The N-th stages of shift registers 5, 6, 7, and 8 are connected to the first stages of the same shift registers by loop signal lines 9, 10, 11, and 12.

Figure 3:
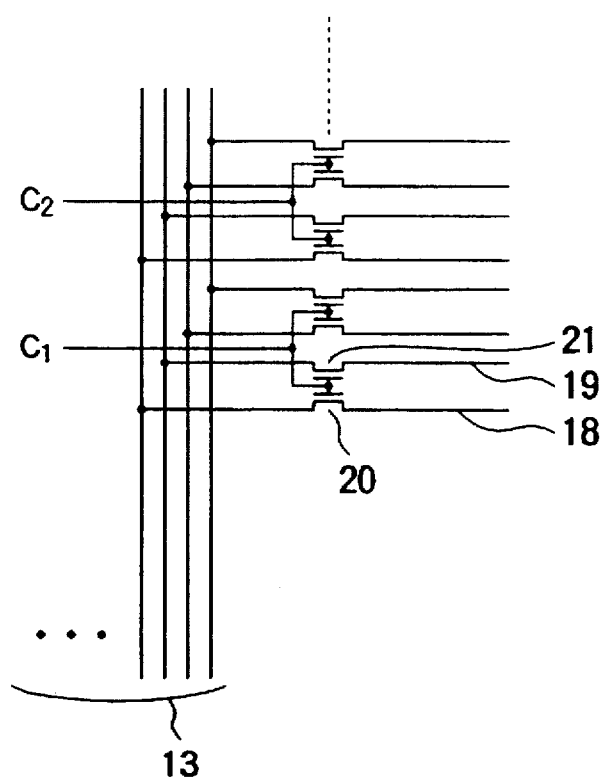
FIG. 3 illustrates interconnections between the bit lines and data bus.

The memory cell arrays 1, 2, 3, and 4 are connected to a data bus 13, the connections being controlled by outputs from the shift registers 5, 6, 7, and 8. The data bus 13 is eight bits wide, with two bits assigned to each of the four memory cell arrays 1, 2, 3, and 4. A more detailed depiction of the data-bus interconnections is shown in FIG. 3.

A resetting circuit 14 is provided to initialize the shift registers 5, 6, 7, and 8. The detailed structure and interconnections of the resetting circuit 14 is shown in FIG. 2.

The memory has various other well-known circuits, such as a decoder for designating row addresses, but these have been omitted so as not to obscure the invention with irrelevant detail.

Figure 2:
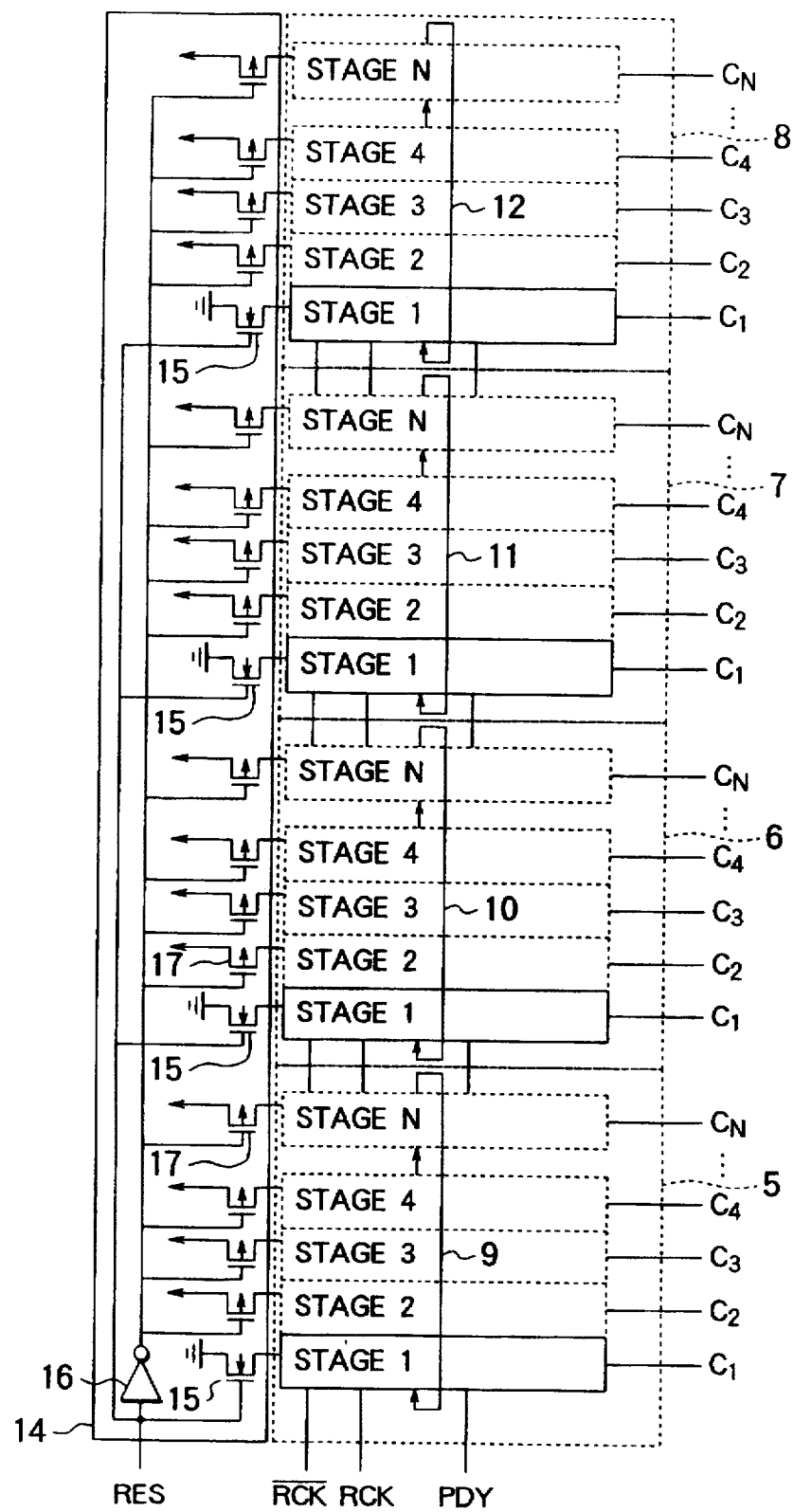
FIG. 2 is a more detailed block diagram of the shift registers and resetting circuit in FIG. 1.

Referring to FIG. 2, the resetting circuit 14 receives a reset signal (RES), which is coupled to the gates of four n-channel metal-oxide-semiconductor (NMOS) transistors 15. These NMOS transistors switchably provide a ground potential to the first stages of the four shift registers 5, 6, 7, and 8. The reset signal is also inverted by an inverter 16 and supplied to the gates of a plurality of p-channel metal-oxide-semiconductor (PMOS) transistors 17, which switchably provide a power-supply potential, higher than the ground potential, to the other stages of shift registers 5, 6, 7, and 8.

The shift registers 5, 6, 7, and 8 are clocked by a complementary pair of clock signals RCK and $\overline{RCK}$. A timing signal PDY is also supplied to control the timing of the outputs of the shift registers. These outputs are column selecting signals $C_1, \ldots, C_N$, the subscripts matching the stage numbers in each shift register 5, 6, 7, and 8.

The loop signal lines 9, 10, 11, and 12 are the same as in FIG. 1.

FIG. 3 shows the data-bus interconnections controlled by, for example, column selecting signals $C_1$ and $C_2$ from shift register 5. The full data bus 13 has eight complementary pairs of signal lines, of which FIG. 3 shows only two pairs. Each memory cell (not shown) is coupled to a complementary pair of bit lines, e.g. bit lines 18 and 19. These bit lines are coupled to the data bus 13 through a corresponding pair of NMOS transfer transistors, e.g. transistors 20 and 21. The gates of both transfer transistors are driven by the same column selecting signal, e.g. column selecting signal $C_1$.

Column selecting signal $C_1$ controls the gates of two pairs of transfer transistors, which are coupled to different complementary pairs of signal lines in the data bus 13, so when column selecting signal $C_1$ is active (high), simultaneous access is provided to two memory cells in memory cell array 1. Both memory cells have the same column address. Column selecting signal $C_2$ provides similar access to two other memory cells, at a different column address in memory cell array 1.

Figure 4:
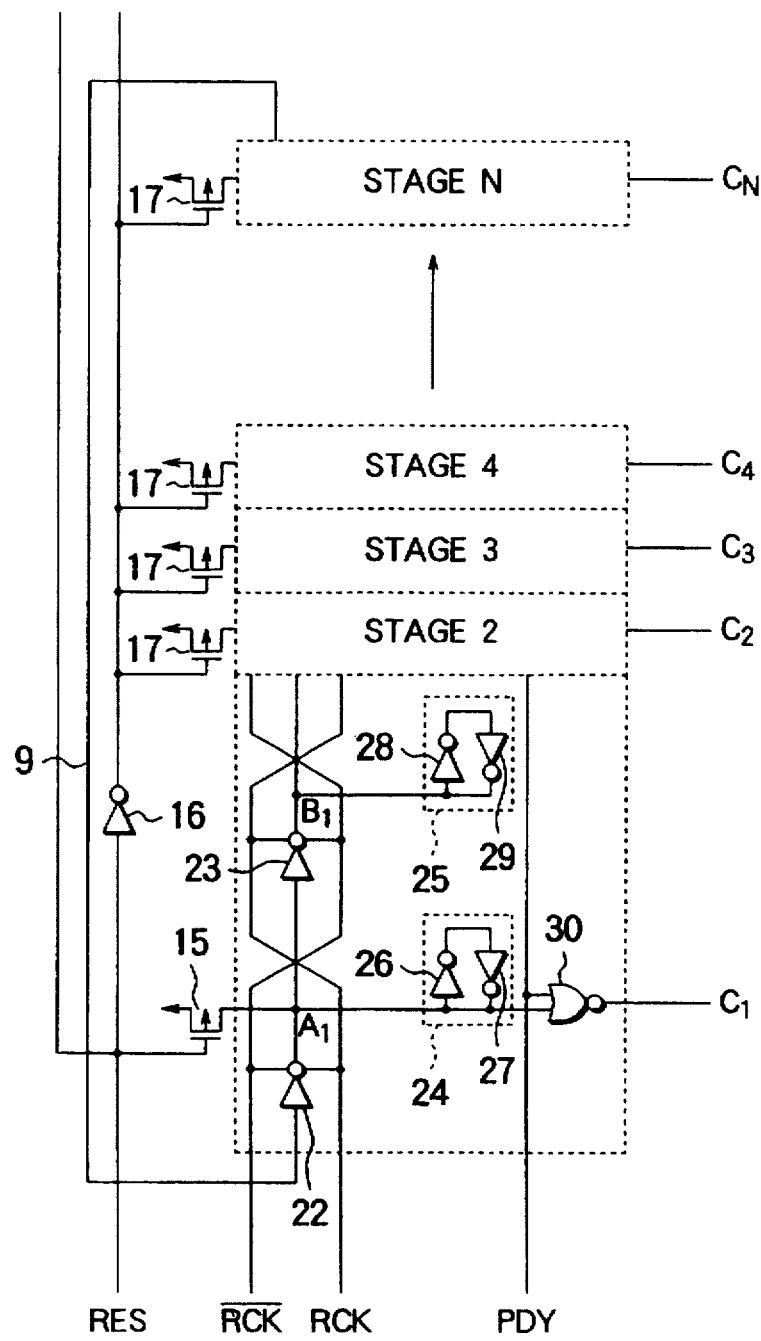
FIG. 4 is a more detailed block diagram showing the structure of one shift-register stage.

FIG. 4 shows the detailed structure of the first stage in shift register 5. All stages in all of the shift registers 5, 6, 7, and 8 have similar structures. The structure comprises a pair of inverters 22 and 23 coupled in series, and a pair of latches 24 and 25 coupled to the output nodes $A_1$ and $B_1$ of respective inverters 22 and 23. Latch 24 comprises a pair of inverters 26 and 27 coupled in an antiparallel or ring configuration. Latch 25 comprises a similar pair of inverters 28 and 29.

The output node $A_1$ of the first inverter 22 in stage one is coupled not only to latch 24 and the input of inverter 23, but also to NMOS transistor 15 in the resetting circuit, and to one input terminal of a NOR gate 30. The other input terminal of NOR gate 30 receives the timing signal PDY. The output of NOR gate 30 is the column selecting signal $C_1$.

Stages two to N of shift register 5 have corresponding nodes $A_2, \ldots, A_N$ and $B_2, \ldots, B_N$ (not shown). Nodes $A_2, \ldots, A_N$ in stages two to N are coupled to PMOS transistors 17 and to NOR gates similar to NOR gate 30, which output column selecting signals $C_2, \ldots, C_N$.

The output node $B_1$ of the second inverter 23 in stage one is coupled to the input of the first inverter (not shown) in stage two. Nodes $B_2, \ldots, B_{N-1}$ (not shown) in stages two to N−1 are similarly coupled to the inputs of the first inverters in stages three to N. Node $B_N$ (not shown) in stage N is coupled through loop signal line 9 to the input of the first inverter 22 in stage one.

The inverters 22 and 23 are clocked by the clock signals RCK and $\overline{RCK}$. Each inverter 22 and 23 alternates between an enabled state in one half of the RCK/$\overline{RCK}$ clock cycle, and a disabled state in the other half of the same clock cycle. In the enabled state, the inverter output is tied to the power-supply level (high) or ground level (low), depending on the input to the inverter. In the disabled state, the inverter output is floating. When RCK is high and $\overline{RCK}$ is low, inverter 22 is enabled and inverter 23 is disabled. When RCK is low and $\overline{RCK}$ is high, inverter 22 is disabled and inverter 23 is enabled.

Next the operation will be described.

Figure 5:
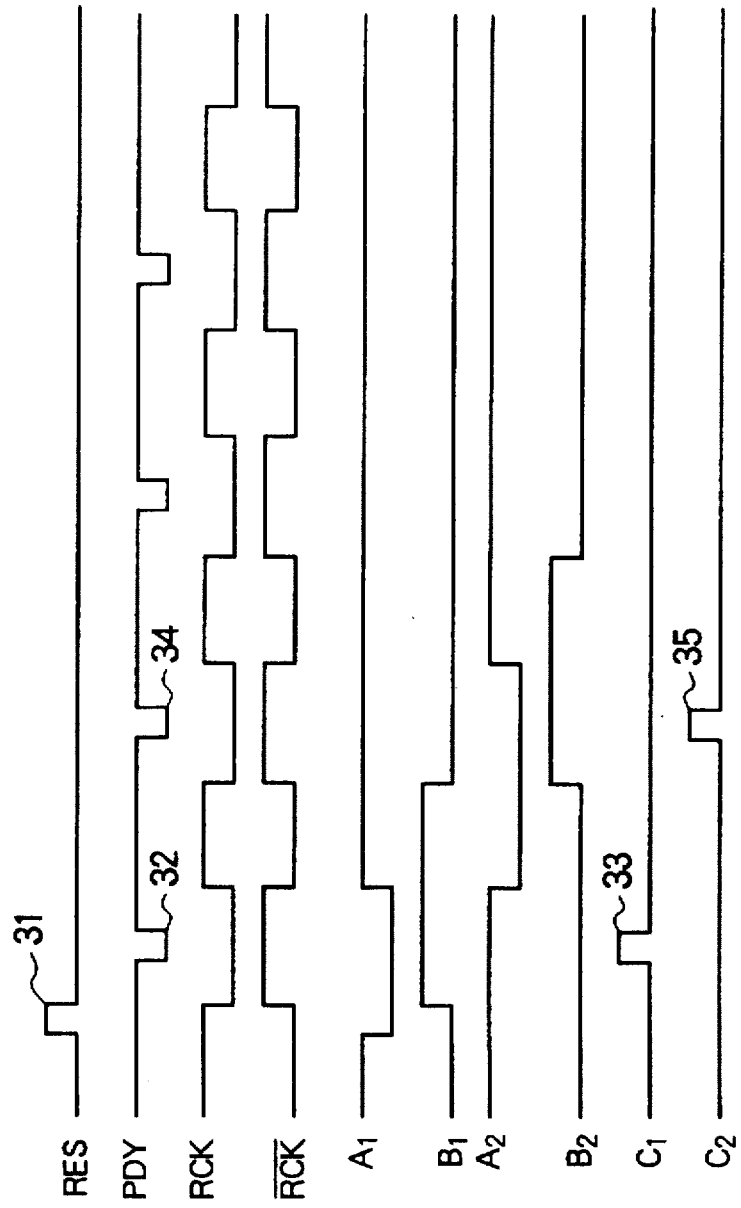
FIG. 5 is a timing diagram illustrating the operation of the serial access memory in FIG. 1.

Referring to FIG. 5, the operation begins with a reset pulse 31 to initialize the shift registers 5, 6, 7, and 8. The reset pulse 31 is applied while RCK is high and $\overline{RCK}$ is low. The timing signal PDY is initially high, so all column selecting signals $C_1, C_2, \ldots, C_N$ are low.

Referring again to FIGS. 2 and 4, the reset pulse turns on all of the transistors 15 and 17 in the resetting circuit 14, thereby forcing node $A_1$ in stage one of each shift register 5, 6, 7, and 8 to the low level, and nodes $A_2, \ldots, A_N$ in stages two to N to the high level. These logic levels are latched by the latches 24 in each stage.

Referring again to FIG. 5, when RES and RCK simultaneously go low, the first inverters 22 in each stage are disabled, leaving nodes $A_1, A_2, \ldots, A_N$ in the above-described states. At the same time the second inverters 23 in each stage are enabled, so the states of nodes $A_1, A_2, \ldots, A_N$ are inverted by the second inverters 23 and transferred to nodes $B_1, B_2, \ldots, B_N$. Node $B_1$ thus goes high, while node $B_2$ remains low. The logic levels of nodes $B_1, B_2, \ldots, B_N$ are latched by the latches 25 in each stage.

While RCK is low, a low pulse 32 of the timing signal PDY is applied. During this low pulse, the logic levels of nodes $A_1, A_2, \ldots, A_N$ are inverted by the NOR gates 30 and become the column selecting signals $C_1, C_2, \ldots, C_N$. Since node $A_1$ is low and nodes $A_2, \ldots, A_N$ are high, this results in a high pulse 33 of column selecting signal $C_1$ while the other column selecting signals $C_2, \ldots, C_N$ remain low.

In the next clock cycle, first RCK goes high and $\overline{RCK}$ goes low, enabling the inverters 22 and disabling the inverters 23 in each stage. As a result, the logic levels of nodes $B_1, B_2, \ldots, B_{N-1}, B_N$ are inverted and transferred to nodes $A_2, A_3, \ldots, A_N, A_1$, respectively. Node $A_1$ now goes low, node $A_2$ goes high, and nodes $A_3, \ldots, A_N$ remain low. In this state another low timing pulse 34 is applied, resulting in a high pulse 35 of column selecting signal $C_2$.

These operations continue in similar fashion, with high pulses appearing in column selecting signals $C_3, \ldots, C_N$ in turn. After $C_N$ goes high, in the next clock cycle the high state of node $B_N$ in stage N is transferred through the loop signal line to node $A_1$ in stage one and inverted, producing another high pulse of column selecting signal $C_1$.

These operations take place simultaneously in all four shift registers 5, 6, 7, and 8. When the column selecting signal $C_K$ from stage K of shift register 5 goes high, so do the corresponding column selecting signals $C_K$ from stage K in each of shift registers 6, 7, and 8. Each of the four column selecting signals $C_K$ controls memory cell access via two bit-line pairs, so the four simultaneously high column selecting signals $C_K$ enable access, via a total of eight bit-line pairs, to eight memory cells at a time. (K is any integer from one to N.)

In each shift register, the low state of node $A_K$ and the resulting high pulse of column selecting signal $C_K$ will be regarded below as an enabling signal that enables access to two memory cells at a time. The enabling signals are shifted simultaneously from stage one (K=1) to stage N (K=N) in all four of the shift registers 5, 6, 7, and 8, then are shifted from stage N to stage one via the loop signal line in each shift register.

One advantage of the first embodiment is that the loop signal lines 9, 10, 11, and 12 are shorter than in a conventional serial access memory of the same W×N×8 organization. The length of a loop signal line is determined by the number of bit lines controlled by the corresponding shift register, and the spacing between the bit lines. If the bit-line spacing is one micrometer (1 µm), for example, then every bit-line pair occupies 2 µm vertically in the drawings, and since each of the N shift-register stages controls two bit-line pairs, the length of each loop signal line 9, 10, 11, or 12 is substantially 4N µm. In a conventional serial access memory having a single N-stage shift register in which each stage controlled eight bit-line pairs, the length of the loop signal line would be 16N µm. By reducing the length of the loop signal lines by a factor of four, the first embodiment avoids the long loop delays associated with the conventional serial access memory, and permits faster clock rates.

Needless to say, the invention is not limited to four shift registers, or to control of two bit-line pairs per register stage. In general, there can be P shift registers, each having N stages, and each stage controlling access to Q bit-line pairs. P can be any integer greater than one; Q can be any integer greater than zero. This shift-register configuration provides access to B memory cells at a time, where B=P×Q.

Another advantage of the first embodiment is that it permits the development of a family of serial access memories having different organizations from a common set of building blocks. This will be illustrated with reference to FIGS. 6 to 9.

FIG. 6 shows a serial access memory having a sixteen-bit word organization (B=16), instead of the eight-bit word organization of the first embodiment. The four shift registers 5, 6, 7, and 8 (P=4) are identical to those in the first embodiment, but each shift-register stage now controls access to four bit-line pairs (Q=4). If there are, for example, two hundred fifty-six stages per shift register (N=256), then each memory cell array accommodates one thousand twenty-four bit-line pairs. The data bus 13 is sixteen bits wide. Row addresses are selected by a row decoder (XDEC) 36. The resetting circuit has been omitted to simplify the drawing.

FIG. 7 shows a similar serial access memory with a twelve-bit word organization. This serial access memory is identical to the one in FIG. 6, except that shift register 8 and its corresponding memory cell array have been removed, and the width of the data bus 13 has been reduced to twelve bits.

FIG. 8 shows a similar serial access memory with an eight-bit word organization, having only two shift registers 5 and 6, and only two memory cell arrays.

FIG. 9 shows a serial access memory with a four-bit word organization, only one shift register 5, and only one memory cell array.

The advantage to the manufacturer is that after designing and testing one of the serial access memories in the family shown in FIGS. 6 to 9, he can easily design the other memories in the same family, just by adding or removing blocks consisting of one shift register and its associated memory cell array. An advantage to the user is that all memories in the family have the same maximum clock-rate specifications, because the loop signal lines are all the same length. This permits use of the same clock parameters in different applications.

Figure 10:
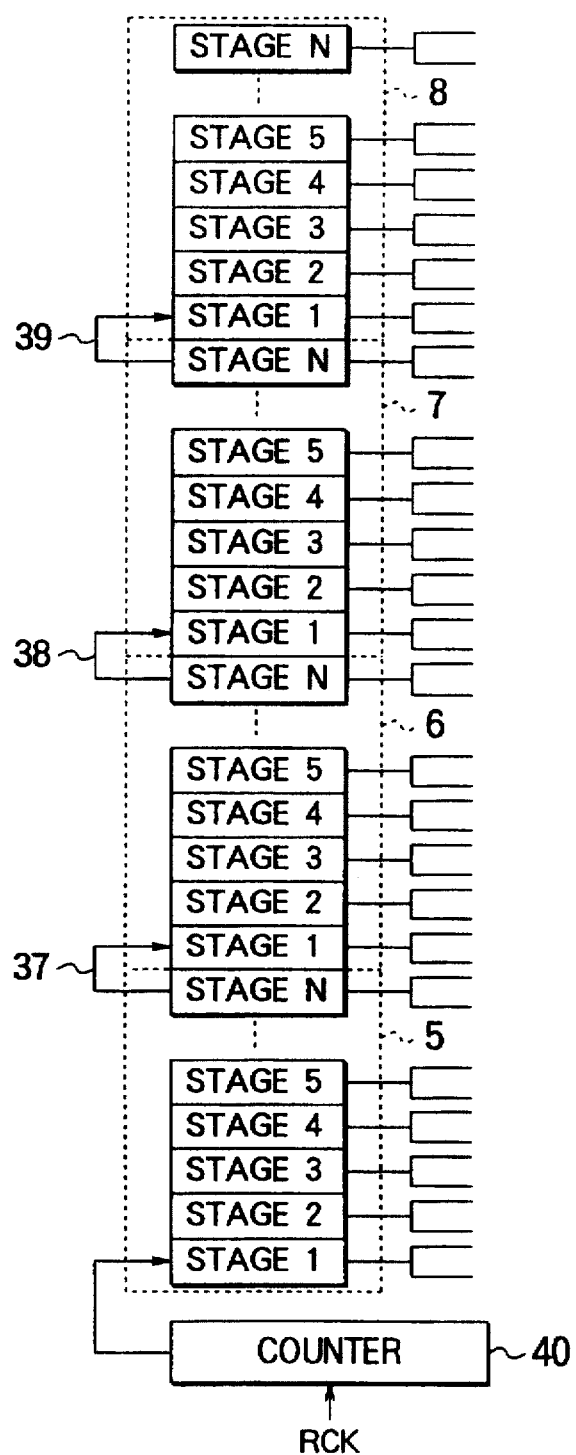
FIG. 10 is a block diagram of another novel serial access memory.

FIG. 10 shows the shift-register configuration of a second embodiment of the invention, in which the loop signal lines are eliminated completely. Shift registers 5, 6, 7, and 8 are the same as in FIG. 1, except that stage N in shift register 5 is coupled via a signal line 37 to stage one of shift register 6, instead of being looped back to stage one of shift register 5. Similarly, stage N of shift register 6 is coupled via signal line 38 to stage one of shift register 7, and stage N of shift register 7 is coupled via signal line 39 to stage one of shift register 8.

Since stage one of shift register 5 does not receive a loop signal from stage N, a divide-by-N counter 40 is provided. This counter 40 counts cycles of the clock signal RCK, and produces a carry signal once every N clock cycles. The carry signal is fed to stage one of shift register 5 in place of a loop signal.

Figure 11:
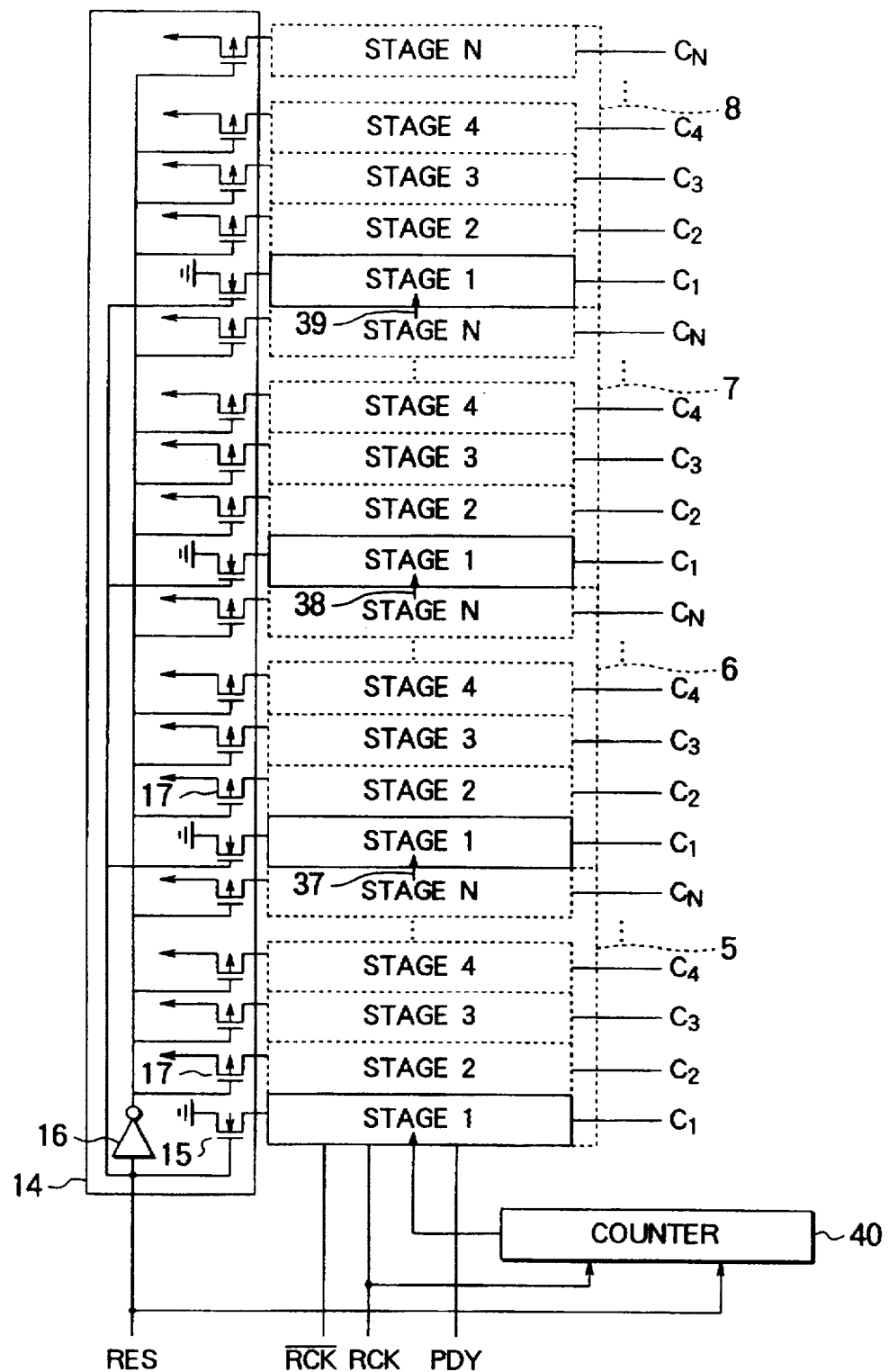
FIG. 11 is a more detailed block diagram of the shift registers and resetting circuit in FIG. 10.

FIG. 11 shows the shift-register configuration of the second embodiment again, together with the resetting circuit 14. The resetting circuit 14 is identical to the resetting circuit 14 in the first embodiment, shown in FIG. 2. The individual stages of the shift registers 5, 6, 7, and 8 in the second embodiment also have the same structure as in the first embodiment, shown in FIG. 4. The only difference is that the loop signal lines of the first embodiment are replaced by signal lines 37, 38, 39 and the counter 40.

Initialization of the second embodiment is the same as the initialization of the first embodiment, except that the reset signal RES also initializes the counter 40. In shifting the enabling signal from stage one to stage N in each shift register 5, 6, 7, and 8, the second embodiment operates exactly like the first embodiment. When the enabling signal reaches stage N in each shift register 5, 6, 7, and 8, at the next clock cycle signal lines 37, 38, and 39 carry enabling signals into stage one of shift registers 6, 7, and 8, and the counter 40 generates a carry signal that produces an enabling signal in stage one of shift register 5.

The second embodiment can support very fast clock rates, because it has no loop delay. It also offers the advantage of easy memory-family design, as illustrated in FIGS. 6 to 9.

Figure 12:
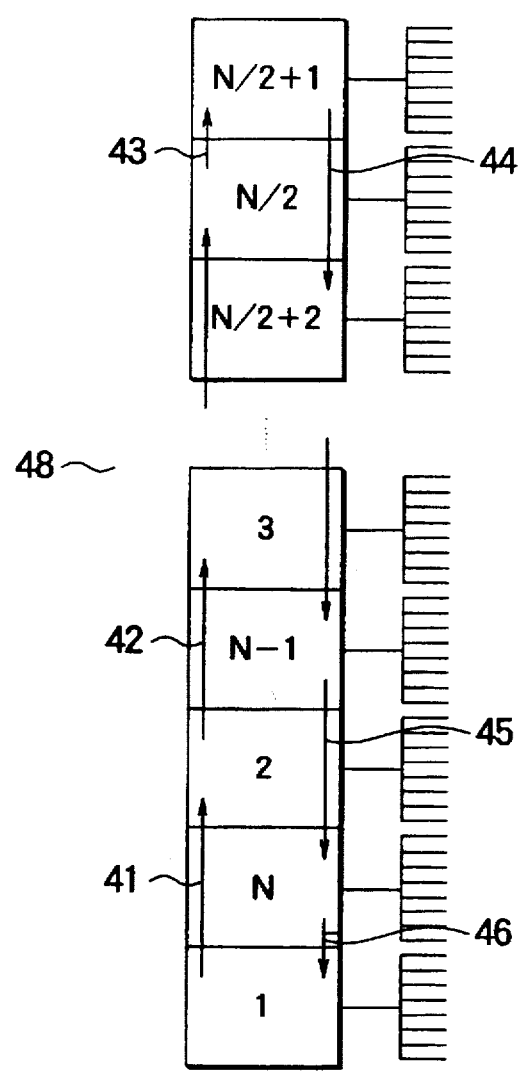
FIG. 12 is a block diagram of the shift register of yet another novel serial access memory.

FIG. 12 shows the shift-register configuration of a third embodiment that also eliminates all loop signal lines. Like the first embodiment, the third embodiment has a W×N×8 organization. The third embodiment has a single N-stage shift register 48, each stage of which has the same circuit structure as in the first embodiment, shown in FIG. 4. Each stage, however, now controls eight bit-line pairs.

As in the first embodiment, the enabling signal is shifted from stage one to stage N, then back to stage one. Differing from the first embodiment, stages one to N of the shift register 48 are disposed in an interleaved manner, with stage N located between stages one and two, stage N−1 between stages two and three, and in general stage N−K between stages K+1 and K+2, for integer values of K from zero to N−2 (except for K=N/2−1).

The enabling signal starts at stage one at the bottom end of the shift register 48 in the drawing and is shifted via signal line 41 into stage two, skipping the intervening stage N. Next, the enabling signal is shifted from stage two to stage three via signal line 42, skipping the intervening stage N−1. The enabling signal continues to be shifted at intervals of two stages in this way, skipping every other stage, until it reaches stage N/2, from which it is shifted via signal line 43 into the adjacent stage N/2+1 at the top end of the shift register 48.

The enabling signal is then shifted from the top end back toward the bottom end through the stages that were skipped on the trip up. From stage N/2+1, the enabling signal is shifted to stage N/2+2, skipping the intervening stage N/2. Shifting continues at intervals of two stages, until the enabling signal reaches stage N via signal line 45 from stage N−1. From stage N, the enabling signal is shifted via signal line 46 into the adjacent stage one at the bottom end of the shift register 48.

Having reached stage one, the enabling signal is shifted into stage two again, and the entire shifting process repeats itself. The enabling signal thus travels cyclically up and down the shift register 48, passing through each stage once per N cycles of the clock signal.

Figure 13:
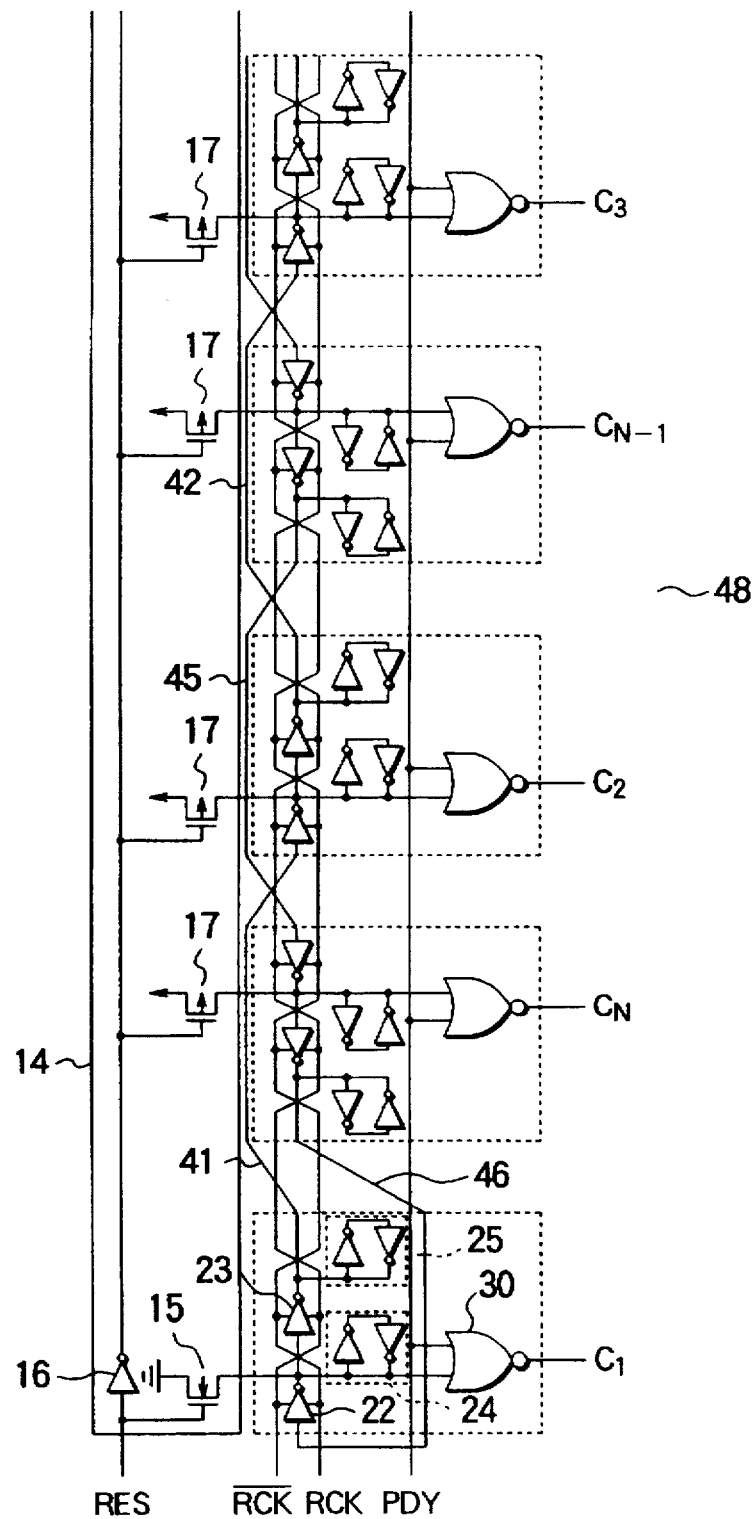
FIG. 13 is a more detailed block diagram showing part of the serial access memory in FIG. 12.

FIG. 13 shows the detailed structure of stages one, two, three, N, and N−1 of the shift register 48 in the third embodiment, using the same reference numerals as in FIG. 4 to denote the inverters 22 and 23, latches 24 and 25, and NOR gate 30. Also illustrated in FIG. 13 is the resetting circuit 14. As in the preceding embodiments, the reset signal RES turns on an NMOS transistor 15 that initializes stage one, and is inverted by an inverter 16 to turn on PMOS transistors 17 that initialize the other stages.

Like the second embodiment, the third embodiment supports very fast clock rates, because all of the signal lines 41, 42, ..., 45, 46 through which the enabling signal is shifted are short.

Figure 14:
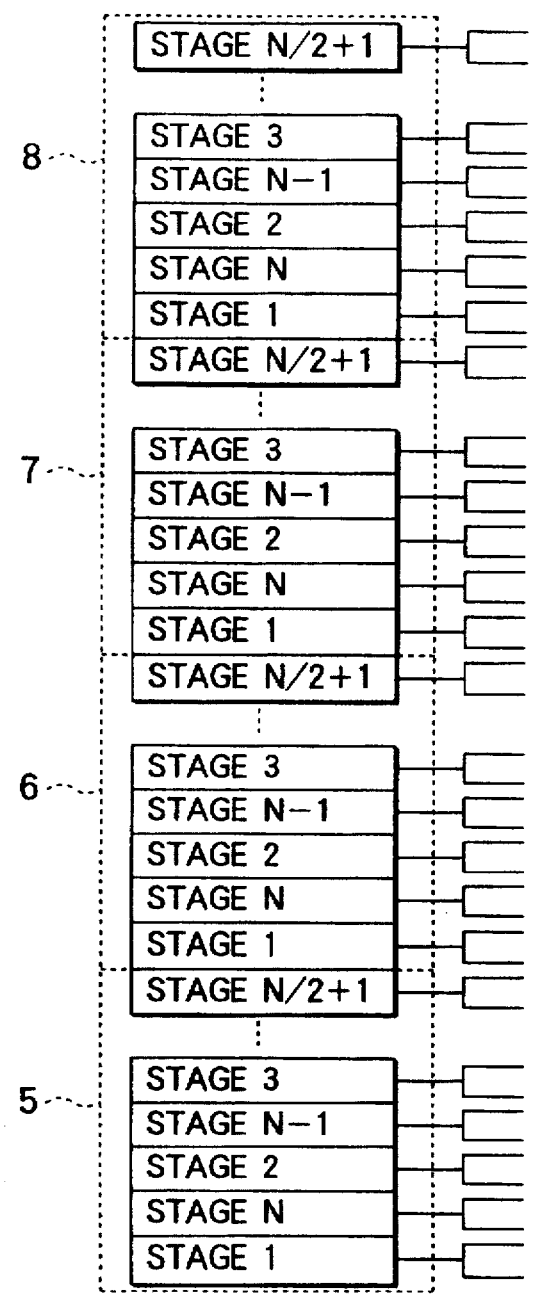
FIG. 14 is a block diagram of the shift registers of still another novel serial access memory.

FIG. 14 shows a fourth embodiment that combines the interleaved shift-register configuration of the third embodiment with the block structure of the first and second embodiments. Only the shift registers are shown in FIG. 14, the memory cell arrays and resetting circuit being the same as in FIG. 1.

The fourth embodiment has a W×N×8 organization with four N-stage shift registers 5, 6, 7, and 8. Each shift-register stage controls two bit-line pairs, as in the first and second embodiments. Each of the four shift registers 5, 6, 7, and 8, however, has the interleaved configuration of the third embodiment, with stage N−K disposed between stage K+1 and stage K+2, for all integers K from zero to N−2 (except K=N/2−1).

The operation of the fourth embodiment can be understood from the operation of the preceding embodiments, so a separate description will be omitted.

The fourth embodiment supports even faster cycle times than the third embodiment, because the signal lines interconnecting the shift-register stages are shorter. This is because the shift-register stages themselves are shorter, as each stage has to accommodate only two bit-line pairs instead of eight. The fourth embodiment also simplifies the design of a family of memories with different organizations, as illustrated in FIGS. 6 to 9.

The scope of the present invention is not limited to the embodiments illustrated in the drawings, but includes many possible variations.

In a variation of the second embodiment, for example, the counter 40 is omitted and stage N of shift register 5 is coupled to the first stages of both shift registers 5 and 6. By eliminating the counter 40 and using a loop signal line for only one of the four shift registers, this variation reduces the size of the memory circuitry, as compared with any of the four embodiments described.

The word width B (the number of memory cells accessed simultaneously) can be varied in any of the preceding embodiments. In particular, the third embodiment can easily be adapted for any word width B at all, including indivisible widths such as B=1 or B=17, i.e., widths equal to integers that cannot be factored, by having each shift-register stage control B bit-line pairs.

Signals that were shown as active high can be made active low, or vice versa, many modifications can be made in the detailed structure of the shift register, and those skilled in the art will readily find still other modifications to be encompassed within the scope of the invention as claimed below.

What is claimed is:

1. A serial access memory having an array of memory cells and providing simultaneous access to B of said memory cells at a time in response to a clock signal, where B is an integer greater than one, comprising:

P shift registers clocked simultaneously by said clock signal, each shift register among said P shift registers having N stages, and each stage among said N stages controlling access to Q of said memory cells at a time, where P, Q, and N are integers, B=P×Q, and P and N are greater than one; and a resetting circuit coupled to said P shift registers, for initializing all of said P shift registers simultaneously to a state such that in each of said P shift registers, access to Q of said memory cells is enabled by one of said N stages and disabled by all other of said N stages.

2. The memory of claim 1, wherein the N stages of each shift register among said P shift registers are disposed side by side, in order from a first stage to an N-th stage, and an enabling signal enabling access to Q of said memory cells at a time is shifted through said N stages in sequential order from said first stage to said N-th stage, in response to said clock signal.

3. The memory of claim 2, wherein each shift register among said P shift registers has a loop signal line for shifting said enabling signal from said N-th stage to said first stage.

4. The memory of claim 2, wherein:

said P shift registers are disposed end-to-end in order from a first shift register to a P-th shift register so that the N-th stage of each of said P shift registers except said P-th shift register is adjacent to the first stage of a corresponding next shift register among said P shift registers; and said P shift registers are interconnected by signal lines so that said enabling signal is shifted from the N-th stage of each of said P shift registers except said P-th shift register to the first stage of said corresponding next shift register.

5. The memory of claim 4, also comprising a counter coupled to the first stage of said first shift register, for counting said clock signal and initializing said first stage of said first shift register, once per N cycles of said clock signal, to a state enabling access to Q of said memory cells.

6. The memory of claim 1, wherein:

the N stages of each shift register among said P shift registers are disposed side by side from a first end of said shift register to a second end of said shift register; and an enabling signal enabling access to Q of said memory cells at a time is shifted through said N stages from said first end toward said second end at intervals of two stages, skipping every other stage, then shifted from said second end toward said first end through the stages thus skipped, this shifting process being carried out cyclically in response to said clock signal, so that said enabling signal passes through each of said N stages once per N cycles of said clock signal.

7. The memory of claim 1, wherein each stage of each shift register among said P shift registers comprises:

two inverters coupled in series and enabled alternately by said clock signal, each of said two inverters remaining enabled for one half of one cycle of said clock signal at a time; and two latches coupled to respective inverters, for latching outputs of said inverters.

8. A family of serial access memories as described in claim 1, the serial access memories of said family having identical values of N but different values of B, Q, and P.

9. A serial access memory having an array of memory cells and a shift register with N stages, each stage of said shift register controlling access to a certain number of said memory cells at a time responsive to a clock signal, wherein:

said N stages are disposed side by side from a first end of said shift register to a second end of said shift register; and an enabling signal enabling access to said certain number of said memory cells is shifted through said N stages from said first end toward said second end at intervals of two stages, skipping every other stage, then shifted from said second end toward said first end through the stages thus skipped, this shifting process being carried out cyclically in response to said clock signal, so that said enabling signal passes through each of said N stages once per N cycles of said clock signal.

10. A method of controlling column access in a serial access memory having memory cells disposed in a row-column array, comprising the steps of:

initializing a set of P shift registers, each shift register having N stages, to a state in which just one stage of each of said P shift registers holds an enabling signal enabling access to Q memory cells at a time, where Q is an integer greater than zero and P and N are integers greater than one, thereby enabling access to a set of P×Q memory cells;

receiving a clock signal having successive cycles; and shifting said enabling signal through all of said P shift registers simultaneously, responsive to said clock signal, thereby enabling access to different sets of P×Q memory cells in different cycles of said clock signal.

11. The method of claim 10, wherein the N stages of each shift register among said P shift registers are disposed side by side, in order from a first stage to an N-th stage, and said enabling signal is shifted through said N stages in sequential order from said first stage to said N-th stage, in response to said clock signal.

12. The method of claim 11, comprising the further step of shifting said enabling signal from said N-th stage to said first stage in each shift register among said P shift registers.

13. The method of claim 11, comprising the further step of shifting said enabling signal from the N-th stage of one shift register among said P shift registers to the first stage of another shift register among said P shift registers.

14. The method of claim 4, comprising the further steps of:

counting said cycles of said clock signal; and initializing said one shift register once every N cycles of said clock signal.

15. The method of claim 10, wherein:

the N stages of each shift register among said P shift registers are disposed side by side from a first end of said shift register to a second end of said shift register; and said enabling signal is shifted through said N stages from said first end toward said second end at intervals of two stages, skipping every other stage, then shifted from said second end toward said first end through the stages thus skipped, this shifting process being carried out cyclically, so that said enabling signal passes through each of said N stages once per N cycles of said clock signal.

16. A method of controlling column access in a serial access memory having memory cells disposed in a row-column array, comprising the steps of:

initializing a shift register having N stages disposed in a linear array with a first end and a second end to a state in which just one of said N stages holds an enabling signal enabling access to Q memory cells at a time, where Q is an integer greater than zero and N is an integer greater than one;

receiving a clock signal having successive cycles; and shifting said enabling signal through said shift register in a first direction from said first end toward said second end at intervals of two stages, skipping every other stage, until said enabling signal reaches said first end of said shift register;

shifting said enabling signal through said shift register in a second direction from said second end toward said first end at intervals of two stages, through those stages that were skipped in said first direction, until said enabling signal reaches said second end of said shift register; and continuing to shift said enabling signal back and forth between said first end and said second end in like manner, so that said enabling signal visits each stage of said shift register once per N cycles of said clock signal, enabling access to a different Q memory cells in each cycle among said N cycles.

17. A serial access memory, comprising:

a plurality of memory cell arrays, each having memory cells disposed at a plurality of column addresses; and a plurality of shift registers, corresponding to said plurality of memory cell arrays, each of said shift registers having a plurality of stages corresponding to said plurality of column addresses, said stages outputting selection signals enabling access to memory cells at the corresponding column addresses, said shift registers being placed in a stage such that said selection signals are output simultaneously by just one stage in each of said shift registers.

18. The memory of claim 17, wherein each of said memory cells arrays has a plurality of said memory cells disposed at each of said column addresses.

19. The memory of claim 17, wherein the stages of each shift register among said shift registers are disposed side by side, in order from a first stage to a last stage, and said selection signals are shifted through the stages of respective shift registers in sequential order from said first stage to said last stage.

20. The memory of claim 19, wherein said shift registers have respective loop signal lines for shifting respective selecting signals from said last stage to said first stage.

21. The memory of claim 19, wherein:
said shift registers are disposed end-to-end in order from a first shift register to a last shift register so that the last stage of each of said shift registers except said last shift register is adjacent to the first stage of a corresponding next shift register among said shift registers; and
said P shift registers are interconnected by signal lines so that said selecting signals are shifted from the last stage of each of said shift registers except said last shift register to the first stage of said corresponding next shift register.

22. The memory of claim 17, wherein:
the stages of each shift register among said shift registers are disposed side by side from a first end of said shift register to a second end of said shift register; and
said selecting signals are shifted through the stages of respective shift registers from said first end toward said second end at intervals of two stages, skipping every other stage, then shifted from said second end toward said first end though the stages thus skipped, this shifting process being carried out cyclically.

* * * * *